United States Patent [19]

Wyatt

[11] 4,360,253
[45] Nov. 23, 1982

[54] SAFETY GLASS MOUNTED TEST RESULT INDICATOR

[75] Inventor: Kenneth L. Wyatt, Oklahoma City, Okla.

[73] Assignee: Western Electric Company, Inc., New York, N.Y.

[21] Appl. No.: 189,403

[22] Filed: Sep. 22, 1980

[51] Int. Cl.³ .................... G02C 1/00; G01R 19/14
[52] U.S. Cl. .................................. 351/158; 324/133
[58] Field of Search .................. 324/158 P, 133, 72.5, 324/149; 351/158; 2/426

[56] References Cited

U.S. PATENT DOCUMENTS 4,086,004  4/1978  Scrivo et al.
4,145,122  3/1979  Rinard et al.

Primary Examiner—John K. Corbin
Assistant Examiner—Rodney B. Bovernick
Attorney, Agent, or Firm—R. P. Miller

[57] ABSTRACT

A test device includes a pair of test probes (21 and 22) which are manipulated onto a succession of test sites (11, 13 and 16) formed on a complex circuit board, and the operator is visually apprised of test results without loss of eye contact with the test sites. Visual appraisal is provided by a small light emitting diode (46) which is activated in accordance with the probed test results. The diode is mounted on the operator's safety glasses (58) and is of such size as to be not discernible when positioned inside the normal focal point of the operator's eye, but a glow is discernible when the diode is operated upon a particular test condition being ascertained by the test probes.

8 Claims, 3 Drawing Figures

SAFETY GLASS MOUNTED TEST RESULT INDICATOR

FIELD OF THE INVENTION

This invention relates to a test result indicator for use with safety glasses and, more particularly, to a test result indicator that permits an operator to maintain eye contact with an article being tested and yet be visually apprised of the results of the test.

BACKGROUND OF THE INVENTION

In the manufacture of complex printed circuit boards, hybrid thin film circuits, large scale integrated circuits and other circuit packs, it is necessary to run numerous manual tests using pairs of probes to ascertain the integrity of circuits paths and operability of circuit components. These tests are very tedious requiring exacting operator concentration and dexterity in manipulating and positioning the test probes. Due to the very close spacing of the circuit paths and terminals on components, eye contact between the test probe tips and the test sites is often lost when the operator looks up to read a meter or other monitor. This loss of eye contact often is accompanied by a slight shifting of one or both probes to engage other closely spaced circuit paths or terminal sites, thus resulting in improper circuit completions and false test readings.

Further, during sequential testing, the loss of eye contact with the test sites and the shifting of the test probes may interrupt the normal required testing sequence. In the testing of components having a large number of terminal sites to be tested, eye contact must be maintained in order that the test probes be sequentially moved from one site to the next test site without skipping a test site. It is thus apparent that there is a need for a test system which will permit an operator to maintain eye contact with test sites during a systematic sequential testing procedure.

In the prior art, various light emitting devices have been mounted on spectacles or eyeglass frames. Usually these devices have been used to provide a means for illuminating a viewing area. In one such device as shown in U.S. Pat. No. 4,086,004 issued Apr. 25, 1978, to Scrivo et al, one of a pair of spectacle bows is formed with a passageway for receiving a fiber-optic bundle that has an optically polished end positioned adjacent to one side of a lens. Light is impressed on the fiber-optic bundle to produce a light beam which impinges on an area in front of the lens.

Another spectacle mounted light emitting device is disclosed in U.S. Pat. No. 4,145,122 issued Mar. 20, 1978, to Rinard et al. In this instance, an infrared light source is mounted on the frame to project a light beam onto an infrared mirror surface of one lens, which beam is then reflected into the eye to form a virtual image behind the corneal surface of the eye. This image is reflected onto the mirror and then onto a detector which is also mounted on the spectacle frame. The detector functions to monitor movement of the eyeball.

SUMMARY OF THE INVENTION

This invention comtemplates, among other things, a simple light emitting device that is attachable to safety glasses worn by a circuit board test operator, and which is selectively illuminated to apprise the operator of various test results. The light emitting device is very small so that when positioned in front of the safety glass lenses, it will not be discernible by the operator. The operator is, therefore, provided with a test result indicator which functions while the operator maintains eye contact with s sucession of circuit sites to be tested.

More particularly, the present invention includes a small light emitting diode that is supported by a pair of thin rigid wires in front of one lens of the operator's safety glasses. The support includes a clip which is readily attached and detached from the operator's safety glass frame. Conductors run from the light emitting diode to a case containing portions of a test circuit. The case is also provided with a clip to permit attachment to a belt or other parts of the operator's wearing apparel. Conductors emanate from the case to a pair of test probes which the operator grasps and manipulates to contact various closely spaced circuit paths or terminals on an electrical device under test. When a particular electrical characteristic, such as continuity, is ascertained, a circuit is completed to actuate the light emitting diode which functions to glow and apprise the operator pf the test result.

The light emitting diode and the supporting wires are so thin and are so positioned within the normal focus of the operator's eye that the operator does not see them, much in the same manner as a viewer is not made aware of the dividing line separating the lenses used in bifocal glasses.

DESCRIPTION OF THE DRAWINGS

Other features and advantages of the present invention will be apparent upon consideration of the following detailed description when considered in conjunction with the accompanying drawing wherein.

DETAILED DESCRIPTION

Figure 1:
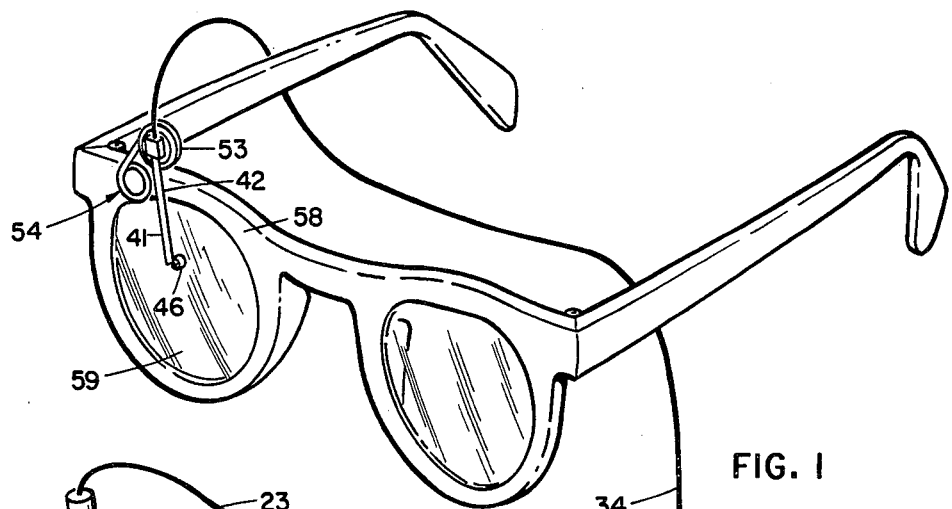
FIG. 1 is a schematic view in perspective showing a circuit test device mounted on a pair of safety glasses in accordance with the principles of the present invention.

In order to illustrate the utility of the invention there is shown in FIG. 1 a circuit board or substrate 10 having vast arrays of closely spaced circuit paths 11, circuit modules 12 with closely spaced terminals 13, and discrete circuit components 14 with closely spaced terminating leads 16. Circuit module 12 may include an array of resistors which are to be sequentially tested by engaging tips 18 and 19 of probes 21 and 22. The probes 21 and 22 are grasped by an operator and sequentially moved from one circuit path to the next adjacent circuit path. In manipulating the probes and tips from one test site to the next, the test procedure is facilitated if the operator can maintain eye contact with the test sites. The probes 21 and 22 are respectively colored red and white to respectively indicate positive and negative polarities.

The tips 18 and 19 are connected within the test probes 21 and 22 to a pair of insulated conductors 23 and 24 that run to a casing 26. The case 26 is provided with a spring bias pivot clip 27 that may be snapped onto the operator's belt or another portion of the operator's wearing apparel. The casing 26 provides a housing for a test circuit. For purposes of simple illustration, the test facility is illustrated as a battery 29. Conductor 23 is connected to the negative terminal of the battery while conductor 24 terminates in a jack 31. A short lead 32 runs from the positive side of the battery to the jack 31. A plug 33 connected to a pair of insulated wires 34 is insertable in the jack 31.

Figure 3:
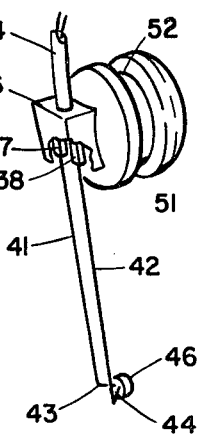
FIG. 3 is a further enlarged view of the mounting for the light emitting diode together with a connector for electrically connecting the light emitting diode to conductors running to a test device.

As shown in FIG. 3, the pair of wires 34 are run to a mini-connector 36, and are connected to sockets 37 and 38. The sockets 37 and 38 may be square in shape to receive a pair of square wires 41 and 42. The lower portions of the wires 41 and 42 are bent to provide L-shaped legs 43 and 44. These legs are connected to terminals of a light emitting diode 46.

Figure 2:
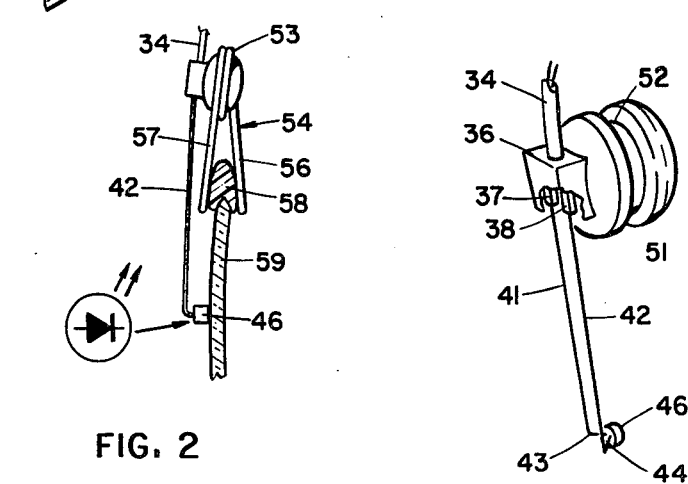
FIG. 2 is an enlarged view partially in section of a clip that may be used for mounting a small light emitting diode in close proximity to the frontal surface of one of the lenses of the safety glasses.

The connector 36 is mounted on a disc 51 which may be constructed of plastic to provide a circumferential groove 52. The disc is snapped into and enveloped by a complete loop 53 of a resilient piano wire clip 54 (see FIGS. 1 and 2). The clip 54 is fabricated with a second pair of spring loops 56 and 57 which are snapped over a frame 58 forming part of a test operator's glasses, e.g., safety glasses with plain or corrective lenses. Dimensions are selected for the clip and connector so that the light emitting diode 46 is positioned closely adjacent to the frontal surface of one lens 59 of the safety glasses.

The light emitting diode 46 and the support wires 41 and 42 are so small that the test operator does not discerne their presence while making a test. For example, a light emitting diode of 0.085" diameter and wires 0.025" square are not visible to the operator when positioned within the normal focal distance of the operator's eye. Normal working focus of a person's eyes is approximately 13". As small items are positioned closer to the eye than the normal focus distance, the items become less discernible. When the light emitting diode is mounted in front of the safety glass lens and within 12-13 millimeters from the eyeball, the operator will not be aware of their presence. The actual position may vary from person to person due to differences in each individual's eyesight. These elements are no more distracting than the line that appears on a pair of bifocal glasses to separate the two lens areas.

In use of the device, the operator engages the tips 18 and 19 with a pair of test sites to ascertain the continuity or current flow. Current flow is accompanied by energization of the light emitting diode 46 which glows and appears as a halo to the operator indicating that a satisfactory test result has been obtained. The operator can continue to manipulate the probes 18 and 19 to various test sites while maintaining eye contact with the circuit paths and terminal sites.

It is understood that other test circuits can be included in the test casing 26 to perform electrical tests on other passive electrical components, such as resistors, capacitors or inductors. Further, a test circuit can be included in the casing 26 to test active components, such as discrete components 14 shown in FIG. 1. The described test facility finds particular utility in testing complex circuitry during or following initial manufacture. Further, the test facility is a useful tool in trouble shooting of installed complex electrical systems, such as electronic telephone switching systems where closely spaced test sites are sequentially tested.

What is claimed is:

1. A test device for attachment to eyeglass frames, which comprises:
    a light emitting diode;
    a clip for attachment to the eyeglass frames;
    means secured to the clip for supporting the diode in close proximity to a lens in the frame and inside the normal focus distance of a user's eye;
    a pair of electrically conductive probes; and
    a test device interconnected between the probes and the light emitting diode for operating the light emitting diode upon the probes ascertaining a predetermined test condition.

2. A test device as defined in claim 1, wherein the clip comprises a resilient wire formed in two loop sections, a first of which snaps over and engages the eyeglass frame and the second of which supports the light emitting diode.

3. A test device as defined in claim 2, which includes:
    a connector engaged and held in the second of said loops; and
    a pair of thin wires insertable at first ends in said connector and supporting the light emitting diodes at second ends thereof.

4. A test device as defined in claim 1, which includes:
    a casing for housing the test device; and
    a second clip secured to the casing for attaching the casing to the user's wearing apparel.

5. An attachment for a test operator's safety glasses, which comprises:
    a pair of thin, relatively stiff wires which are not readily discernible when positioned within the focus of the eye of an operator;
    a light emitting diode of a size that is not readily discernible when positioned within the focus of the eye of the operator, said diode being secured to the first ends of said wires;
    means for securing the other ends of said wires to the frame of the operator's safety glasses to position said diode within the focus of the eye of the operator; and
    means responsive to a test result for generating a signal and applying said signal to said wires to operate said diode to apprise the operator of the test result.

6. A test result indicator for use with safety glasses, which comprises:
    a test device for indicating a test condition and accordingly generating an electrical signal;
    a light emitting diode of a small size that is not readily discernible when positioned inside the normal focus of a wearer of the safety glasses;
    means attached to the safety glasses for supporting the light emitting diode within the field of vision of the wearer but inside the normal focus of the eye of the wearer; and
    means for applying the signal from the test device to energize the light emitting diode to produce a glow that is discernible by the wearer.

7. A test result indicator as defined in claim 6, wherein said signal applying means includes a pair of wires connected to said light emitting diode and said wires are of such dimension as to be not discernible to the wearer.

8. A test result indicator as defined in claim 6, which comprises:
    a connector having a pair of sockets for receiving said pair of wires; and
    said supporting means includes a clip formed from a resilient wire to provide a pair of looped sections, a first of which includes two loops for receiving the edge of the safety glass, and a second of which envelopes and supports the connector.

* * * * *